United States Patent [19]

Kantrud et al.

[11] Patent Number: 4,714,150

[45] Date of Patent: Dec. 22, 1987

[54] DROP SHUTTLE

[75] Inventors: Steven G. Kantrud, Crystal; Steven V. Ericson, Wyoming; Karl R. Seidel, Jr., St. Paul, all of Minn.

[73] Assignee: Micro Component Technology, Inc., St. Paul, Minn.

[21] Appl. No.: 772,361

[22] Filed: Sep. 4, 1985

[51] Int. Cl.⁴ .............................................. B65G 37/00
[52] U.S. Cl. ............................... 198/463.3; 198/468.6; 198/535; 209/655
[58] Field of Search ...................... 198/436, 437, 463.3, 198/468.6, 535, 536; 209/573, 655, 698; 193/31 R, 31 A

[56] References Cited

U.S. PATENT DOCUMENTS

| | | | |
|---|---|---|---|
| 1,949,964 | 3/1934 | Keller et al. | 198/463.3 |
| 2,413,767 | 1/1947 | Hyde | 198/468.6 |
| 2,771,980 | 11/1956 | Parducci et al. | 198/463.3 |
| 2,813,643 | 11/1957 | Prentice | 198/463.3 |
| 3,727,757 | 4/1973 | Boissicat | 209/73 |
| 4,068,767 | 1/1978 | Tippetts | 214/6 BA |
| 4,234,418 | 11/1980 | Boissicat | 209/573 |
| 4,423,815 | 1/1984 | Boissicat | 209/573 |
| 4,478,352 | 10/1984 | Amundson et al. | 221/13 |
| 4,520,931 | 6/1985 | Evain | 209/542 |

FOREIGN PATENT DOCUMENTS 1217869 5/1966 Fed. Rep. of Germany ... 198/463.3
1247215 8/1967 Fed. Rep. of Germany ... 198/463.3

Primary Examiner—Joseph E. Valenza
Attorney, Agent, or Firm—Lawrence M. Nawrocki

[57] ABSTRACT

The present invention is a device for receiving an integrated circuit (10) presented at a pick-up station (22), transferring the integrated circuit (10) laterally to a spaced output chute (84, 90), and depositing the integrated circuit (10) into said chute (84, 90). The device includes a shuttle (24) mounted for pivotal and lateral movement on a shaft (40). The shuttle (24) is driven by an angled arm (62) mounted pivotally beneath the shuttle (24). The arm (62) is pivoted about an axis by means of a motor (56) and a linking shaft (52). A housing (76) carried by the arm (62) at an end thereof opposite the end by which it is pivoted encases and holds therein a spherical bearing (78) which is free to swivel within the housing (76) for rotation about three mutually perpendicular axes. The bearing (78) has an aperture (80) formed therethrough. The aperture (80) accommodates a rod (72) carried by the shuttle (24) at its underside. The rod (72) extends generally parallel to an axis along which integrated circuit devices (10) enter the shuttle (24). As the drive arm (62) is pivoted one way or another, it draws the shuttle (24) both laterally and pivotally about the shaft (40) on which the shuttle (24) is mounted.

11 Claims, 9 Drawing Figures

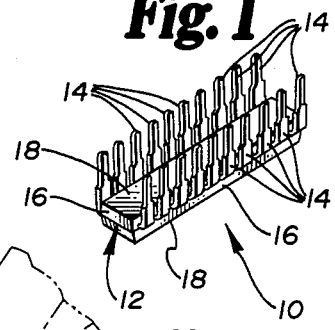
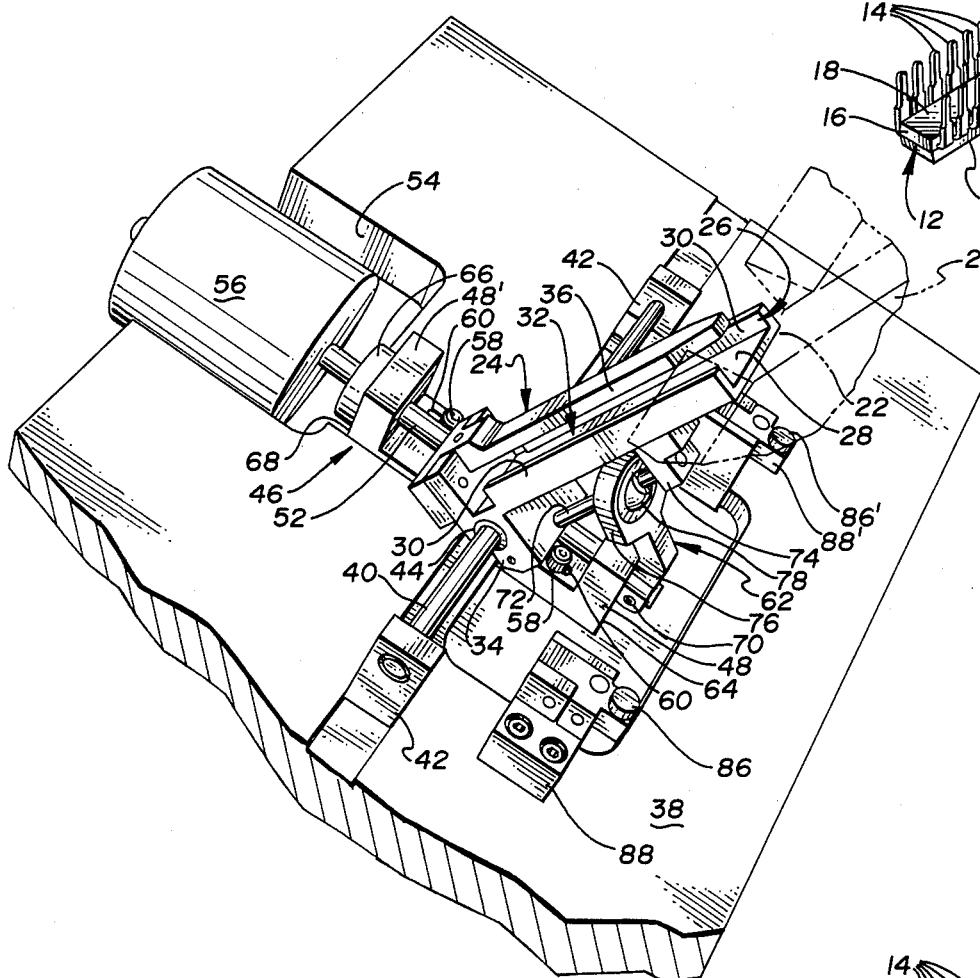
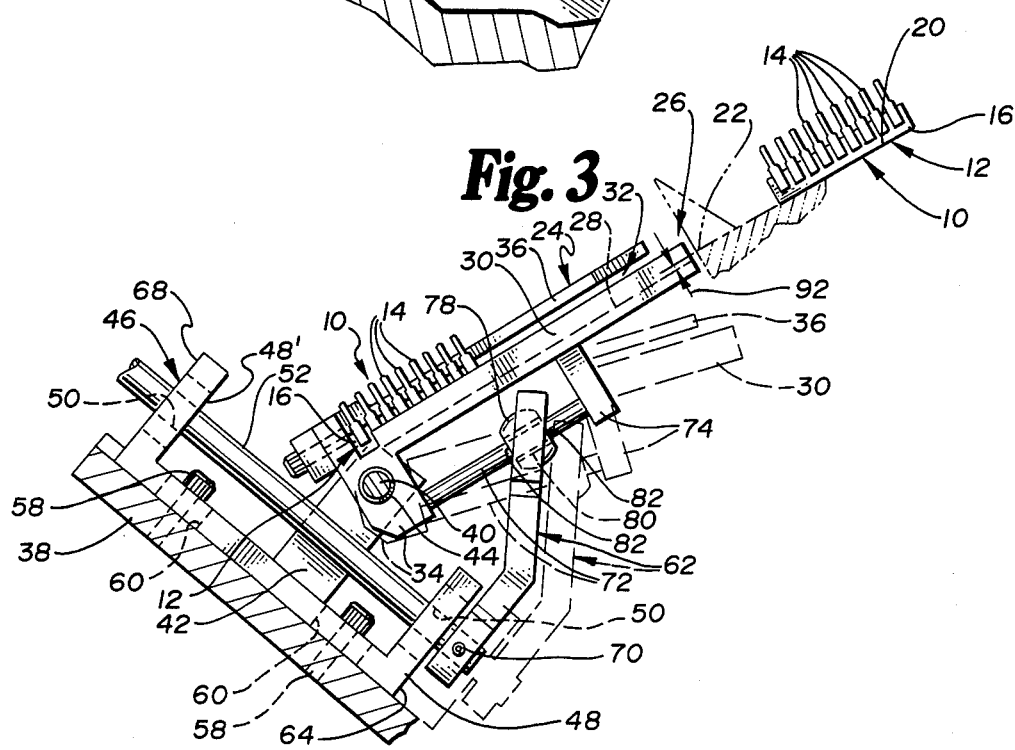

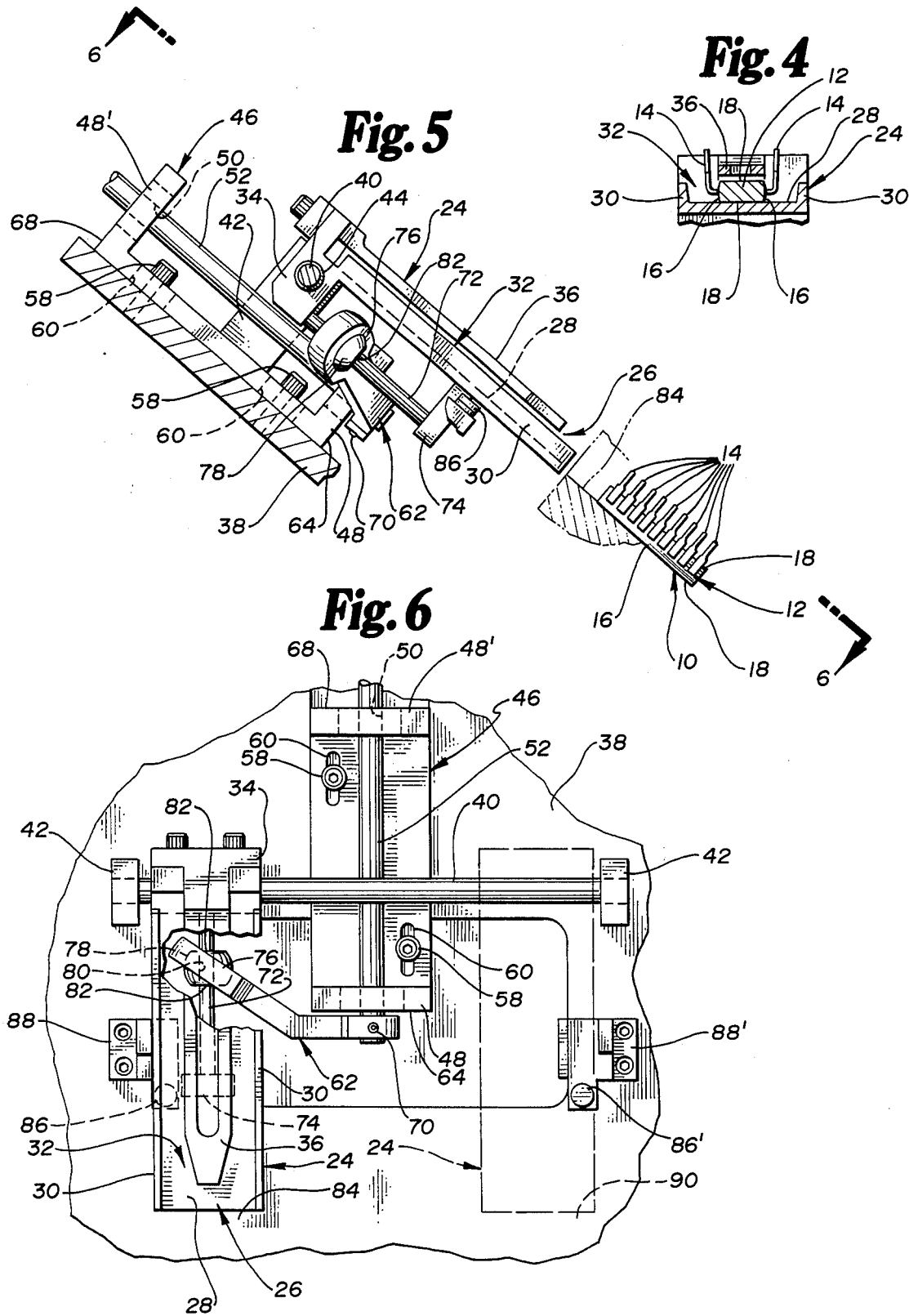

DROP SHUTTLE

TECHNICAL FIELD

The present invention is related generally to the field of apparatus for handling integrated circuit devices. Specifically, the invention is directed to apparatus for receiving integrated circuit devices from a singulation apparatus and feeding them to one or more test sites, spaced laterally from a station at which the devices are received from the singulation apparatus, at which they are interfaced with a testing apparatus.

BACKGROUND OF THE INVENTION

Integrated circuit devices have numerous applications in industry. In many of these applications, it is necessary that they be accurate to a known degree. This necessitates the testing of each device before it enters the marketplace.

Various types of integrated circuit testers have been developed. Typically, these testers perform their function at a high rate of speed. Therefore, it is necessary to convey the device for testing to and from a test site interfacing with the tester also at a high rate of speed.

These testers typically test the devices one at a time. Therefore, it is important that the devices be delivered to the test site individually. In the prior art, methods of singulation (that is, methods of isolating a single device from many of such devices) have been developed for performance by integrated circuit handlers which incorporate a single test site and cycle devices to be tested thereto.

The speed at which integrated circuits can be tested has, heretofore, been dependent upon the speed at which the devices can be delivered to the test site for testing. As previously indicated, prior art structures typically included only a single test site.

An apparatus that can test more than one integrated circuit device per singulation apparatus, but without the complexity of multiple testers and test feeders, would be a significant advancement in the art. Multiple test sites fed by each singulator would enable processing of integrated circuits more quickly than with one test site, and incorporating a single drive mechanism for feeding the integrated circuits into plural test sites would reduce the complexity of the apparatus and, commensurately, reduce the potential of malfunction.

Use of various types of shuttles is common in the prior art. One shuttle device typically requires means for mounting the shuttle for pivoting between an orientation in which it receives an integrated circuit device and one in which it deposits the device into a chute leading to a test site. Such a shuttle is characterized as a "drop shuttle". Typically, such a shuttle pivots to define a plane, the chute being immediately below the station at which the shuttle receives the device. This would be true, of course, where there is a single test site. Multiple test site handlers would necessarily require shuttles of this type to be moved laterally.

The present invention functions to overcome the problems of the prior art and addresses the desirable features dictated by the prior art. It is an improved shuttle apparatus for use in handling integrated circuit devices at high speeds.

SUMMARY OF THE INVENTION

The present invention is an improved apparatus for utilization in an integrated circuit device handler interfacing with a tester apparatus, wherein the handler employs multiple test sites. The apparatus invention functions to receive an integrated circuit device singulated from one of a plurality of magazine tracks and passing down an inclined platen, to transport the device laterally with respect to the direction the device has passed down the platen, to change the direction of obliquely downwardly movement of the device, and to deposit the device into an output chute. The apparatus includes a shuttle having an entrance at a first end thereof. Means are provided for mounting the shuttle for lateral and pivotal motion between positions at which the entrance to the shuttle is registered with the pick-up station and at which the entrance to the shuttle is registered with an output chute. A drive arm is provided for concurrently moving the shuttle laterally and pivoting it between a first position, at which its entrance is registered with the pick-up station, and a second position, at which its entrance is registered with an output chute. The arm is pivotally mounted at a first end thereof beneath the shuttle. A second end of the arm is operatively connected to the shuttle so that, as the drive arm is made to pivot, the shuttle will be moved between said first and second positions.

The invention can include means for pivoting the drive arm in a manner as previously discussed. Such means can take the form of a motor having a stub shaft capable of being rotatably reciprocated, and appropriate couplings mating the stub shaft of the motor to the drive arm.

In a preferred embodiment, the shuttle can be pivotally mounted to a fixed position shaft. While being able to be pivoted about the shaft, it is able also to be concurrently moved laterally along the length of the shaft. Such mounting enables, therefore, simultaneous lateral and pivotal movement of the shuttle.

Also in the preferred embodiment, the shuttle can be provided with a rod aligned along an axis along which an integrated circuit device enters the shuttle. Typically, such a rod would be mounted to the underside of the shuttle to facilitate mating of the drive arm to the rod.

When such a rod is provided, the drive arm can be provided, at its second end, or end opposite that at which it is pivoted, with a housing holding therein a spherical bearing. While the bearing is held closely within the housing, it is free to pivot, with respect to the housing, about three mutually perpendicular axes.

The bearing is provided, in this embodiment, with an aperture formed therethrough. The aperture is shaped and sized to accommodate passage of the rod, carried by the shuttle, therethrough. By passing the rod through the aperture in the bearing and by holding the bearing within the housing at the end of the drive arm, pivoting of the drive arm will cause the drive arm to draw the shuttle along the fixed shaft to which it is mounted. Because the drive arm is of a fixed length, as it is pivoted, its apparent dimension as viewed from the side of the apparatus will decrease as it is pivoted. As can be seen, therefore, the shuttle will also be drawn downwardly toward its second position in which the entrance to the shuttle will be registered with an output chute.

The present invention is, therefore, a structure which can be employed to feed integrated circuit devices to plural test sites. Dual output chutes can be provided, each leading to one of a pair of test sites. When such output chutes leading to dual test sites are employed, the drive arm can be pivoted alternately to opposite sides of its position at which its entrance is registered with the pick-up station from the magazine.

The present invention is thus an improved structure for feeding integrated circuit devices from a magazine to dual test sites of a modern integrated circuit handler. Additional features and advantages obtained in view of those features will become more apparent with reference to the DETAILED DESCRIPTION OF THE INVENTION, appended claims, and accompanying drawing figures.

BRIEF DESCRIPTION OF THE DRAWINGS

FIG. 1 is a perspective view of an integrated circuit device known as a DIP (dual-in-line package) as known in the prior artt;

FIG. 2 is a perspective view of an apparatus in accordance with the present invention with a shuttle thereof in a first position in registration with a pick-up station to which integrated circuit devices are fed from a magazine;

FIG. 3 is a side elevational view of the apparatus of FIG. 2;

FIG. 4 is a sectional view taken generally along the line 4—4 of FIG. 3;

FIG. 5 is a side elevational view, similar to FIG. 3, but with the shuttle entrance in registration with one of plural output chutes;

FIG. 6 is a plan view taken generally along the line 6—6 of FIG. 5;

DETAILED DESCRIPTION OF THE INVENTION

Figure 7:
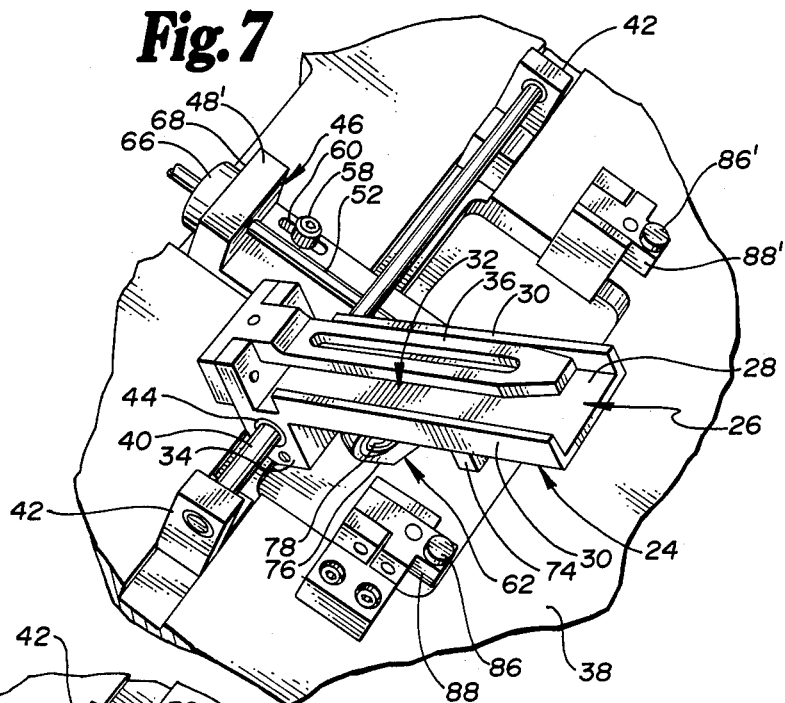
FIG. 7 is a perspective view illustrating the shuttle intermediate its first and second positions on one side of its position wherein its entrance is in registration with the pick-up station.
Figure 8:
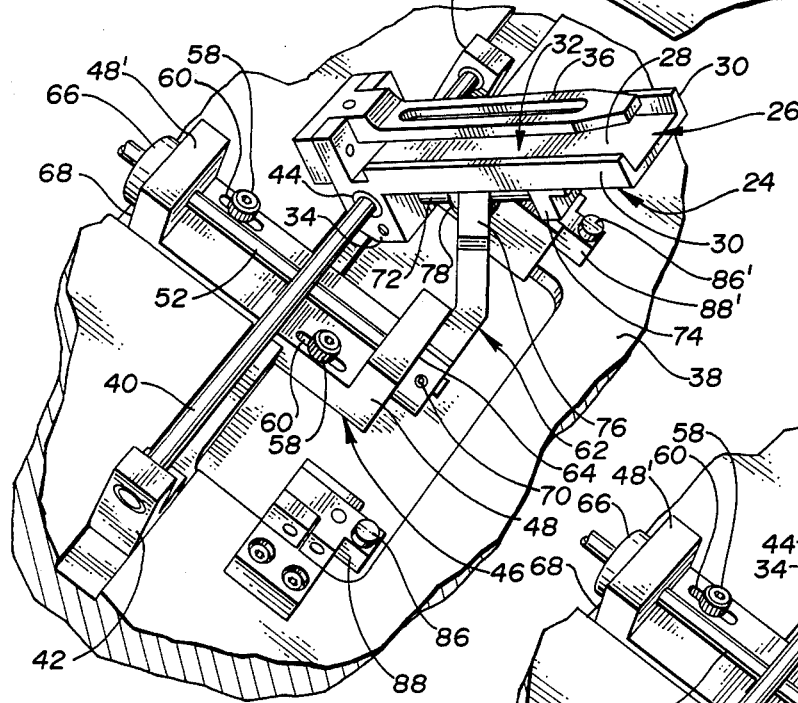
FIG. 8 is a perspective view illustrating the shuttle intermediate its first and second positions wherein the shuttle is on the other side of its position wherein its entrance is in registration with the pick-up station.
Figure 9:
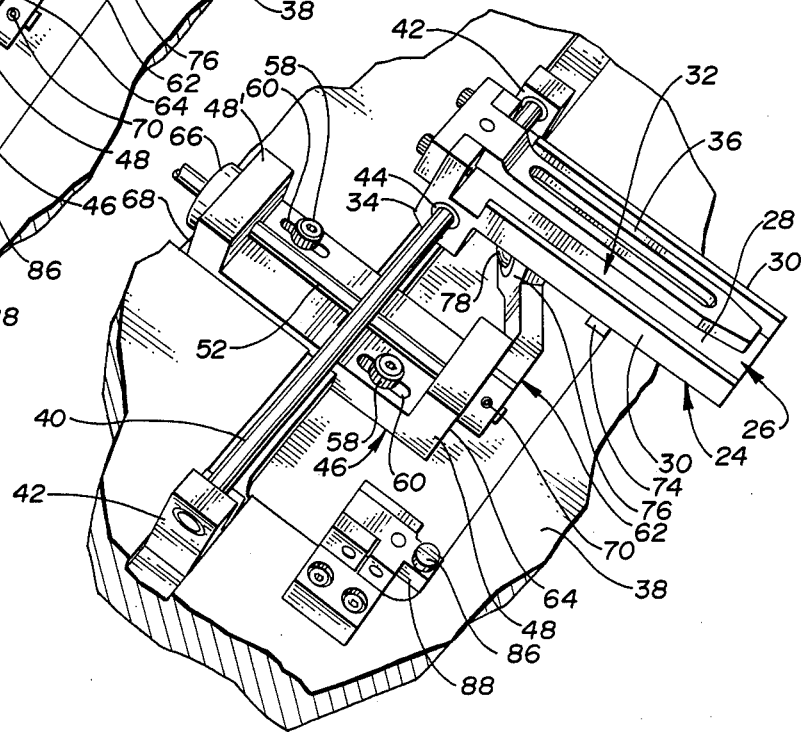
FIG. 9 is a view in perspective wherein the shuttle is in position with its entrance in registration with the output chute opposite that with which it is registered as illustrated in FIGS. 5 and 6.

Referring now to the drawings wherein like reference numerals denote like elements throughout the several views, FIG. 1 illustrates a dual-in-line package (DIP) 10 with which the present invention is intended to be utilized. The DIP 10 includes a generally planar main body portion 12 and two rows of elongated contact elements 14, each row extending from one of opposite lateral sides 16 of the main body portion 12. Each row defines a plane generally perpendicular to a plane defined by either of two oppositely facing surfaces 18 of the main body portion 12. A spider-like structure is, therby, defined.

While the invention described hereinafter will make reference to handling of DIPs 10, it will be understood that appropriate portions of the structure can be reconfigured to accommodate other types of integrated circuit devices such as small outline integrated cirucits (SOICs), etc.

FIG. 2 illustrates in phantom a platen 20 down which a singulated DIP 10 can pass to a pick-up station 22. As seen in FIG. 2, a shuttle device 24, having an entrance 26 at one end thereof, is disposed so that the entrance 26 is substantially in registration with the pick-up station 22.

The shuttle 24 is of an elongated construction and is configured so as to accommodate a DIP 10 therein. The shuttle 24 includes a floor 28 and side walls 30 which together form a trough 32 in which a DIP 10 can be received. The shuttle 24 includes a base 34, and a tongue member 36 extends from the base 34 generally parallel to, and above, the trough 32 formed by the floor 28 and sidewalls 30.

A DIP 10 entering the shuttle trough 32 will be held in position, therefore, by the tongue 36. The pairs of contact elements 14 of the DIP 10 will straddle the tongue 36 so as to limit lateral movement of the device 10 while it is received within the shuttle 24 as is best seen in FIG. 4.

The shuttle 24 is mounted to a base plate 38, a portion of which is seen in the figure. Mounting is accomplished by means of a fixed position shaft 40 secured between a pair of uprights 42. A bushing 44 is provided within the base 34 of the shuttle 24, the bushing 44 being fitted over the shaft 40. The bushing 44 permits lateral movement of the shuttle 24 along the shaft 40 and pivotal movement thereabout.

Referring now to FIG. 3, a rack 46 is adjustably mounted to the base plate 38 for movement upwardly and downwardly therealong for a purpose as will be discussed hereinafter. The rack 46 includes a pair of uprights 48, 48', each having an aperture 50 through which a shaft 52 passes.

FIG. 2 illustrates the base plate 38 as having a recess 54 formed therein. The recess 54 accommodates a motor 56 having a stub shaft extending therefrom. As seen in the figures, the shaft 52 accommodated by the apertures 50 in the rack uprights 48, 48' is an extension of the motor stub shaft. It will be understood, however, that the shaft 52 accommodated by the apertures 50 in the uprights 48, 48' can be different than the motor shaft but linked thereto by appropriate couplings.

The rack 46 is secured to the base plate 38 by screws 58 passing through corresponding slots 60 elongated in a direction of the elongation of the rack 46 itself. The screws 58 are externally threaded and are received within internally threaded apertures within the base plate 38. When adjustment of the rack 46 becomes necessary to be made, the screws 58 merely need be loosened and the rack 46 manipulated so that the relative positioning of the screws 58 within the slots 60 is adjusted.

An angled drive arm 62 is secured to the shaft 52 at a location therealong closely proximate an outwardly facing side 64 of the lower upright 48. Similarly, a collet 66 is secured to the shaft 52 closely proximate an outwardly facing surface 60 of the upper upright 48'. When the shaft 52 passing through the apertures 50 in the rack uprights 48, 48' is not the motor shaft itself, but merely linked thereto, the collet 66 functions to prevent the shaft 52 and angled drive arm 62 carried thereby from slipping out of the rack 46.

It is intended that, as the rack 46 is adjusted upwardly and downwardly, the angled drive arm 62 secured to the shaft 52 passing through the uprights 48, 48' be, similarly, adjusted relative to the base plate 38. This necessary adustment is for a purpose as will be discussed hereinafter. Method of adjustment of the drive arm 62 will depend, however, upon whether the shaft 52 accommodated by the rack uprights 48, 48' is an extension of the motor shaft itself or merely coupled thereto. In the former case, the drive arm 62 would probably have to be adjusted by loosening a set screw 70 by which it is secured to the shaft 52. This would be particularly true where the motor 56 is not adjustable. If the shaft 52 accommodated by the apertures 50 in the rack uprights 48, 48' were merely coupled to the shaft of the motor 56, however, the set screw 70 by which the drive arm 62 is secured to the shaft 52 would not have to be loosened. All that would be necessary would be decoupling the shaft 52 from the motor stub shaft and adjusting the location of the rack 46, the shaft 52 carried thereby, and the drive arm as an assembly.

As best seen in FIG. 3, the shuttle 24 can carry, on an underside thereof, a rod 72. The rod 72 is aligned along an axis parallel to an axis along which an integrated circuit device 10 enters the shuttle 24. The rod 72 extends between the base 34 of the shuttle 24 and an appendage 74 extending downwardly from the floor 28 of the trough 32.

An end of the drive arm 62 opposite that at which it is mated to the shaft 52 defines a housing 76 in which a generally spherical bearing 78 is received. The interior contours of the housing 76 closely approximte the outer contours of the bearing 78 and hold the bearing 78 therein for rotation about three mutually perendicular axes.

Opposite sides of the bearing 78 are faceted, and an aperture 80 extends through the bearing 78 between faces 82 thus defined. The aperture 80 is sized and shaped to accommodate the rod 72 carried by the shuttle 24. As the shaft 52 pivots the drive arm 62 thereabout, therefore, the arm 62 will draw the shuttle 24 in one direction or another along the shaft 40 on which it is disposed for lateral movement, depending upon the direction of rotation of the drive shaft 52 and concurrent pivoting of the drive arm 62. As the arm 62 is made to pivot, its apparent dimension as seen from the side will decrease as can be seen when comparing FIGS. 3 and 5. Consequently, as the shuttle 24 is moved laterally upon its mounting shaft 40, it will also be pivoted downwardly to a position at which its entrance 26 will be substantially in registration with an output chute 84 leading to a test site (not shown).

Because of friction between the integrated circuit device 10 and the tongue 36 of the shuttle 24, the device 10 will be retained within the trough 32 until the shuttle 24 comes to a stop in the position wherein its entrance 26 is registered with the chute 84. When the entrance 26 becomes registered, however, the device 10 will be free to be acted upon by gravity, and it will pass outwardly from the shuttle 24 and down into the chute 84 to the test site.

Means can be provided for ascertaining when the shuttle 24 is in its position wherein its entrance 26 is in registration with the output chute 84. Such information can be inputted, for example, to the motor 56 so that further rotation of the shaft 52 and concurrent pivoting of the drive arm 62 is not attempted. The figures illustrate a contact sensor 86 engagable by the shuttle 24 when it is in its discharge position. A sensor mounting pad 88 can be utilized to accurately position the sensor 86. It will be understood, however, that, while a contact sensor is illustrated, any appropriate type of sensing structure can be employed for the purpose of ascertaining the location of the shuttle 24.

As best seen in FIG. 6, the present invention can be employed for moving a shuttle 24 laterally along its mounting shaft 40 in either of opposite directions. Each side of the central, up position of the shuttle 24 is substantially symmetrical with respect to the opposite lateral position.

In operation, the shuttle 24 would initially be in its position wherein the entrance 26 thereto is in registration with the pick-up station 22. A DIP 10 released from the station 22 passes into the shuttle trough 32, and means (not shown) can be employed to affirm that an integrated circuit device 10 has been received therein. A signal can be initiated by control means (not shown) to actuate the motor 56 to rotate the shaft 52 in a first direction. For example, the shuttle 24 might begin moving to a position as illustrated in FIG. 7. As movement continues, the shuttle 24 achieves the position illustrated in FIGS. 5 and 6, and the DIP 10 carried therein passes into the output chute 84.

Once the DIP 10 has vacated the shuttle trough 32, the motor 56 is directed to rotate the shaft 52 in a direction opposite that in which it was initially rotated to return the shuttle 24 to a position at which its entrance 26 is in registration with the pick-up station 22. Once in that position, it receives another DIP 10 therein.

With the second DIP received by the shuttle 24, the motor 56 receives a signal to continue rotation of the shaft 52 in the direction in which it was rotated to return the shuttle 24 to its pick-up position. The downward pivoting of the drive arm 62 will draw the shuttle 24 laterally in the opposite direction and downwardly so that its entrance 26 is substantially in registration with the second output chute 90.

The cycle thus described can be reperformed as many times as necessary. Operation can continue, however, as long as integrated circuit devices 10 are continued to be introduced at the pick-up station 22.

As previously discussed, the rack 46 provides for upward and downward adjustment of the drive arm 62. As can be seen in FIG. 3, the floor 28 of the trough 32 should be slightly below the platen 20 down which the integrated circuit devices 10 pass as indicated at 92. This is so that devices 10 passing into the shuttle 24 do not get hung up in entering.

FIG. 3 also illustrates the relative effect upon the shuttle 24 by adjusting the rack 46 and, consequently, the drive arm 62 downwardly. As can be seen by the position of the drive arm 62 and shuttle 24 illustrated in phantom, the entrance 26 to the shuttle 24 will be drawn downwardly as the drive arm 62 is adjusted downwardly. The phantom structure in FIG. 3 is exaggerted for illustration purposes.

As can be seen in view of this discussion, however, should the shuttle 24 become inadvertently vertically misaligned with the pick-up station 22, adjustment can be made to position it correctly relative to that station 22. If the entrance 26 has become positioned too far downwardly, the rack 46 and, consequently, the drive arm 62 can be adjusted upwardly until the trough 32 is in an appropriate location proximate the pick-up station 22.

As best seen in FIG. 6, regardless of the positioning of the drive arm 62 relative to an axis of the drive shaft 52, the shuttle 24 will always be moved laterally the appropriate distance, since the dimensions of the drive arm 62 do not become varied. The only effect of adjustment, therefore, will be the vertical positioning of the entrance 26 to the shuttle 24 relative to the pick-up station 22.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for receiving an integrated circuit device passing down an inclined platen to a pick-up station, transporting the device laterally with respect to a direction in which the device has passed down the platen, and depositing the device into an output chute, comprising:
   (a) a shuttle having an entrance at one end registrable with the station and the chute;
   (b) a shaft mounting an end of said shuttle opposite said end having said entrance for pivoting thereabout and lateral movement therealong between a first position in registration with the station and a second position in registration with the chute;
   (c) a drive arm for concurrently moving said shuttle laterally and pivoting said shuttle between said first and second positions, said arm having a first end at which it is mounted for pivoting to define a plane generally perpendicular to a plane defined by an axis aligned along the direction in which the device has passed down the platen and an axis about which said drive arm pivots, and a second end at which it is operatively connected to said shuttle; and
   (d) actuation means for pivoting said drive arm.

2. Apparatus as defined in claim 1, wherein said shuttle slides laterally along said shaft.

3. Apparatus as defined in claim 1, wherein said shuttle pivots about said shaft between said first and second positions.

4. Apparatus for receiving an integrated circuit device passing down an inclined platen to a pick-up station, transporting the device laterally with respect to a direction in which the device has passed down the platen, and depositing the device into one of two output chutes spaced on opposite sides of the pick-up station, comprising:
   (a) a shuttle having an entrance at a first end registrable with the pick-up station and the output chutes and a second end;
   (b) a fixed position shaft on which said shuttle is mounted at said second end for pivoting about said shaft and lateral movement therealong;
   (c) a drive arm pivotally mounted by a first end thereof beneath said shuttle and operatively connected at a second end thereof to said shuttle; and;
   (d) means for pivoting said drive arm in opposite directions.

5. Apparatus as defined in claim 4, wherein said shuttle further comprises means for maintaining the orientation of integrated circuit devices retained within said shuttle.

6. Apparatus as defined in claim 4, wherein said drive arm further comprises a spherical bearing housed within said second end thereof.

7. Apparatus as defined in claim 6, wherein an aperture is formed within said spherical bearing.

8. Apparatus as defined in claim 7, wherein said shuttle carries a rod alinged along an axis along which integrated circuit devices enter said shuttle, and wherein said rod is received within said aperture formed in said spherical bearing.

9. Apparatus as defined in claim 4, wherein pivoting of said drive arm draws said shuttle between the pick-up station and one of the two output chutes.

10. Apparatus as defined in claim 4, wherein said drive arm, as it rotates, urges said shuttle between a first position, wherein it is registered with the pick-up station, and one of two second positions, wherein it is registered with one of the output chutes.

11. Apparatus for receiving an integrated circuit device passing down an inclined platen to a pick-up station, transporting the device laterally with respect to a direction in which the device has passed down the platen, and depositing the device into an output chute, comprising:
   (a) a shuttle having an entrance at one end registrable with the station and the chute, said shuttle carrying a rod aligned along an axis along which an integrated circuit device enters said shuttle;
   (b) means mounting such shuttle or lateral and pivotal motion between a first position in registration with the station, and a second position in registration with the chute.
   (c) a drive arm for concurrently moving said shuttle laterally and pivoting said shuttle between said first and second positions, said arm having a first end at which it is mounted for pivoting to define a plane generally perpendicular to a plane defined by an axis aligned along the direction in which the device has passed down the platen and an axis about which said drive arm pivots, and a second end at which said drive arm carries a housing mounting a spherical bearing through which said rod passes; and
   actuation means for pivoting said drive arm.

* * * * *